United States Patent [19]

Ho

[11] Patent Number: 5,469,097
[45] Date of Patent: Nov. 21, 1995

[54] TRANSLATOR CIRCUIT WITH SYMMETRICAL SWITCHING DELAYS

[75] Inventor: Kenneth Ho, Cupertino, Calif.

[73] Assignee: Advanced Micro Devices, Inc., Sunnyvale, Calif.

[21] Appl. No.: 438,456

[22] Filed: May 10, 1995

Related U.S. Application Data

[63] Continuation of Ser. No. 118,067, Sep. 8, 1993, abandoned.

[51] Int. Cl.$^6$ .................. H03K 5/08; H03K 19/0175; H03K 5/12
[52] U.S. Cl. .................. 327/170; 327/318; 326/73
[58] Field of Search .................. 307/263, 567, 307/475, 443, 451, 559; 326/73, 108, 66, 77; 327/318, 319, 328, 320, 321, 170

[56] References Cited

U.S. PATENT DOCUMENTS

| | | | |
|---|---|---|---|
| 4,499,609 | 2/1985 | Muska | 327/320 |
| 4,647,799 | 3/1987 | Hsu | 307/475 |
| 4,797,583 | 1/1989 | Ueno | 307/475 |
| 4,812,676 | 3/1989 | Yang | 307/559 |
| 4,849,659 | 7/1989 | West | 307/475 |
| 5,148,061 | 9/1992 | Hsueh | 307/475 |
| 5,248,909 | 9/1993 | Aoki | 326/77 |
| 5,283,482 | 2/1994 | Chen | 307/475 |
| 5,315,179 | 5/1994 | Pelley | 307/475 |

FOREIGN PATENT DOCUMENTS

| | | | |
|---|---|---|---|
| 1277089 | 6/1979 | United Kingdom | 307/475 |

*Primary Examiner*—William L. Sikes
*Assistant Examiner*—Tiep H. Nguyen
*Attorney, Agent, or Firm*—Raymond Kam-On Kwong; Joseph A. Sawyer, Jr.

[57] ABSTRACT

A translator circuit for providing symmetrical switching delays for use with a power line for a differential amplifier having a first signal line and a complementary second signal line, the translator circuit including: a first voltage clamp coupled to the first signal line and to the power line for limiting a voltage differential between the power line and the first signal line; and a second voltage clamp coupled to the power line and the second signal line for limiting a voltage differential between the power line and the second signal line. The translator circuit provides reduced sensitivity to variations in process parameters, power supply voltages, temperature and manufacturing tolerances. The translator circuit also provides symmetrical tracking between the rise to rise and the fall to fall delays of an emitter coupled logic to complementary metal-oxide semiconductor translator circuit.

17 Claims, 4 Drawing Sheets

5,469,097

TRANSLATOR CIRCUIT WITH SYMMETRICAL SWITCHING DELAYS

This is a continuation of application Ser. No. 08/118,067 filed on Sep. 8, 1993 and now abandoned.

FIELD OF THE INVENTION

This invention relates generally to logic interface and translator circuits and more particularly to ECL to CMOS translators.

BACKGROUND OF THE INVENTION

In the area of computer data processing systems, various types of digital logic circuits are used in different parts of the processing system. The various circuit types operate at different switching speeds and are used to provide optimal performance for the processing system. In order to transfer data from one part of the processing system having logic of one circuit type (e.g. emitter coupled logic (ECL)) to another part of the processing system having logic of another circuit type (e.g. complementary metal-oxide semiconductor (CMOS)), a translation is often required from one circuit type to another circuit type, because the circuit types operate with different input/output voltages corresponding to high and low logic levels.

Bipolar ECL voltage levels have a relatively small voltage swing of only about 0.8 volts. CMOS voltage levels have a larger voltage swing of about 5.0 volts. Since many of the processing systems are designed with both ECL and CMOS logic circuits, there are interface circuits required, such as ECL to CMOS translator circuits, to allow these two different types of circuits to communicate to each other. For example, ECL to CMOS translators are used to shift the voltage levels of the ECL input logic signals to voltage levels which can be recognized by the CMOS logic circuits.

The conventional translators do not provide a CMOS output that symmetrically tracks an ECL input. For example, it is desirable that the delay between the ECL signal rise and the CMOS signal rise be equal to the delay between the ECL signal fall and the CMOS signal fall. The designs of conventional ECL to CMOS translators do not provide this symmetrical tracking of the signal rise and fall. The delays between the ECL input signal transitions and the CMOS output signal transitions are often not symmetrical. For example, the fall to fall delay between the ECL input and the CMOS output may be less than the rise to rise delay between the ECL input and the CMOS output due to the difference in voltage levels required for switching between logic levels. In typical prior translators, the difference between fall to fall delay and rise to rise delay can be greater than 1 nanosecond (ns). To provide a symmetrical delay, the difference between the fall to fall delay and rise to rise delay should be 0.3 ns or less.

In addition, conventional translators are sensitive to variations in process parameters, power supply voltages, temperature and manufacturing tolerances. This sensitivity can significantly affect the symmetrical tracking of signal rise and fall.

In many applications it is not necessary that there be a symmetrical tracking of the rise and fall. However, when the ECL input signal is in the form of ECL differential input signals which are used to carry both data information and the clock frequency of a system, such as a non-return-to-zero, invert-to-one (NRZI) or data/frequency signal, the lack of symmetry in the CMOS output signal caused by the translator will result in inaccurate detection of the clock frequency.

Accordingly, there is a need in the art for a circuit that provides reduced sensitivity to variations in process parameters, power supply voltages, temperature and manufacturing tolerances. There is also a need in the art for a circuit that provides symmetrical tracking between the rise to rise and the fall to fall delays.

SUMMARY OF THE INVENTION

The need in the art is addressed by a circuit for providing symmetrical switching delays for a differential amplifier including a first signal line and a second signal line complementary to the first signal line and for use with a power line. The present invention includes a first voltage clamp coupled to the first signal line and to the power voltage line for limiting a voltage differential between the power voltage line and the first signal line. A second voltage clamp is coupled to the power voltage line and the second signal line for limiting a voltage differential between the power voltage line and the second signal line.

In a specific embodiment the circuit further includes a third voltage clamp coupled to the first signal line and to the second signal line for limiting a voltage differential between the first signal line and the second signal line.

In another specific embodiment the first signal line and the second signal line are complementary metal-oxide semiconductor compatible.

In another specific embodiment the first and second voltage clamps each further include a first transistor having a drain and a gate coupled to the power voltage line and a second transistor having a drain and a gate coupled to a source of the first transistor and a source coupled to the first signal line.

In another alternate specific embodiment the third voltage clamp further includes a first pair of p-n diodes coupled in series between the first signal line and the second signal line for limiting the voltage differential between the first and the second signal lines. A second pair of p-n diodes is coupled in series between the second signal line and the first signal line for limiting the voltage differential between the second and the first signal lines.

In another specific embodiment a translator circuit for generating an output signal is provided which is complementary metal-oxide semiconductor compatible for a differential amplifier responsive to differential input emitter coupled logic signals for generating a first signal and a second signal complementary to the first signal. The translator circuit includes a first voltage clamp coupled to a upper power voltage and to the first signal for limiting a voltage differential between the upper power voltage and the first signal. A second voltage clamp is coupled to the upper power voltage and to the second signal for limiting a voltage differential between the upper power voltage and the second signal.

In an alternate specific embodiment the translator circuit of further comprises a third voltage clamp coupled to the first signal line and to the second signal line for limiting a voltage differential therebetween.

The circuit of the present invention provides reduced sensitivity to variations in process parameters, power supply voltages, temperature and manufacturing tolerances. The circuit also provides symmetrical tracking between the rise to rise and the fall to fall delays.

DESCRIPTION OF THE PREFERRED EMBODIMENT

The present invention relates to an improvement in a translator circuit. The following description is presented to enable one of ordinary skill in the art to make and use the invention as provided in the context of a particular application and its requirements. Various modifications to the preferred embodiments will be readily apparent to those skilled in the art, and the generic principles defined here may be applied to other embodiments. Thus, the present invention is not intended to be limited to the embodiments shown, but is to be accorded the widest scope consistent with the principles and novel features disclosed herein.

Figure 1:
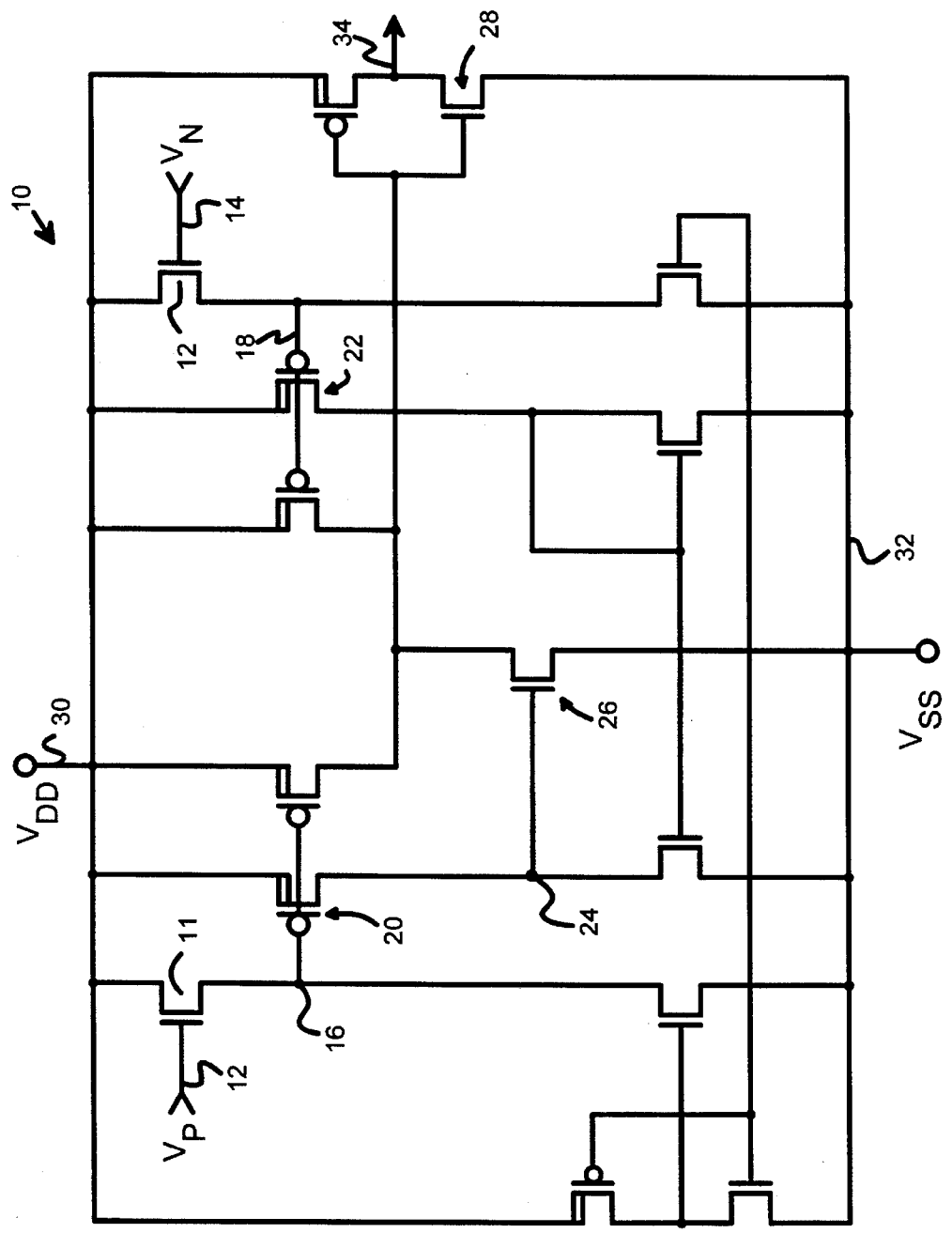
FIG. 1 is an illustrative diagram of a conventional ECL to CMOS translator circuit implemented with CMOS transistors.

FIG. 1 is an illustrative diagram of a conventional ECL to CMOS translator circuit 10 implemented with CMOS transistors. The circuit has a differential input comprising the ECL input positive $V_p$ 12 and the ECL input negative $V_n$ 14. These input signals determine the state of the circuit node 16 and the circuit node 18, respectively. The circuit node 16 is the input to the gate of the transistor 20 and the circuit node 18 is the input to the gate of the transistor 22. The transistor 20 amplifies the signal and the source of the transistor 20 is connected to the circuit node 24. The circuit node 24 is the input to the gate of the transistor 26 and the drain of the transistor 26 is coupled to the transistor 28, whose source is the CMOS output 34.

This circuit has a number of shortcomings. The first shortcoming is the inoperability of the circuit when both of the differential ECL inputs are at a lower than normal voltage, which can occur if the ECL inputs are at a low common mode voltage. If the ECL input positive $V_p$ 12 and the ECL input negative $V_n$ 14 are both below the threshold of transistors 11 and 14, respectively, then both transistors 11 and 14 will be "ON" and both transistors 20 and 22 will be turned "ON", which is a faulty state of the circuit.

The second shortcoming is that during normal operation, the circuit node 24 swings from the power $V_{dd}$ 30 to the ground $V_{ss}$ 32, which are nominally 5 volts and 0 volts, respectively. However, the threshold voltage of the transistor 26 is 1 volt. To turn the transistor 26 "ON" the circuit node 24 must only transition between 0 to 1 volt, but to turn the transistor 26 "OFF" the circuit node 24 must transition between 5 to 1 volts. Since the slew rate of circuit node 24 is essentially constant over the transition range, the switching of the transistor 26 is not symmetrical, because switching the transistor 26 "ON" is much faster than switching the transistor 26 "OFF". In a similar manner the switching of the transistor 28 is not symmetrical, because switching the transistor 28 "OFF" is faster than switching the transistor 28 "ON".

Figure 3:
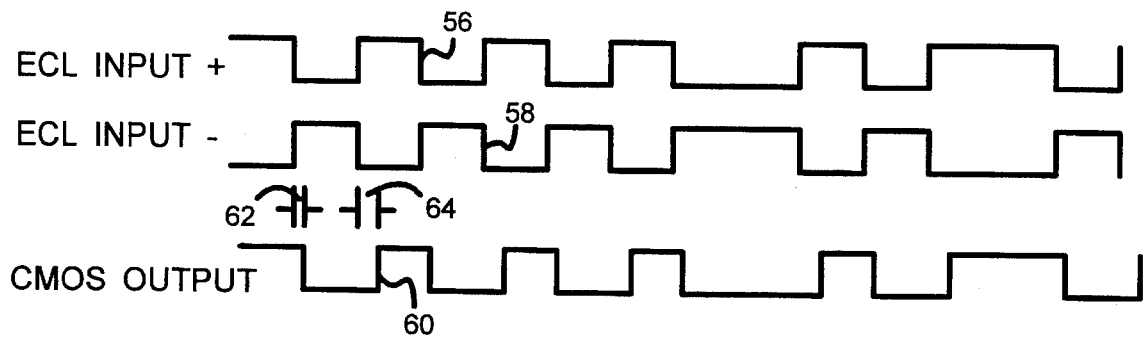
FIG. 3 is an illustrative timing diagram of the relationship between an ECL input signal and a CMOS output signal for a conventional ECL to CMOS translator.

The lack of symmetrical switching is illustrated in FIG. 3. As shown the delays between the ECL positive input 56 and the ECL negative input 58, and the CMOS output 60 are not symmetrical. In particular, the fall to fall delay 62 is much shorter in this example than the rise to rise delay 64.

The third shortcoming of the ECL to CMOS translator circuit 10 is that if the high voltage of either the circuit node 16 or the circuit node 18 is equal to the power $V_{dd}$ 30 minus 1 volts, then the transistor 20 or the transistor 22, respectively, will not turn "OFF" completely. This will result in the transistors turning "ON" fast, but slowly turning "OFF". This characteristic contributes to unsymmetrical switching delays.

Figure 2:
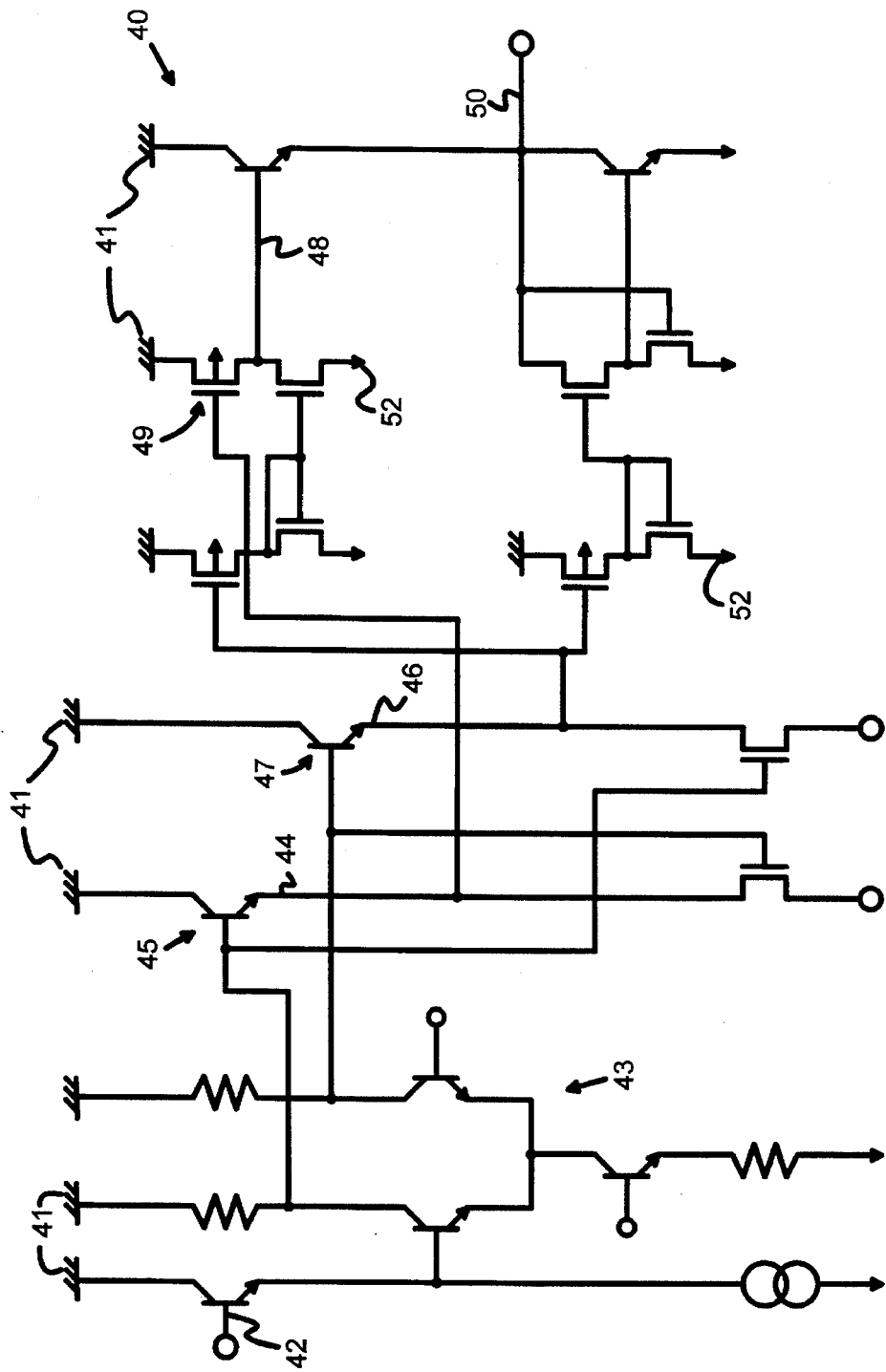
FIG. 2 is an illustrative diagram of a conventional ECL to CMOS translator circuit implemented with bipolar and CMOS transistors.

FIG. 2 is an illustrative diagram of a conventional ECL to CMOS input buffer 40 implemented with bipolar and CMOS transistors. In this circuit the input is the ECL signal input 42, which is amplified through the differential amplifier 43 and the transistor 45 and the transistor 47. These transistors drive an ECL to MOS level shifter, which includes the transistor 49. The output is the CMOS output signal 50.

The shortcoming of the ECL to CMOS input buffer 40 is that the voltages at the signal 44 and the signal 46 are dependent on any variations in the power voltage $V_{cc}$ 41. The signal 48 is also dependent on any variations in the power voltage $V_{cc}$ 41. The signal 48 transitions through a large voltage swing from the power voltage $V_{cc}$ 41 to the ground 52, which is a 5 volt swing. This results in an unsymmetrical rise to rise and fall to fall switching of the circuit in the manner illustrated in FIG. 3.

In summary the conventional ECL to CMOS translator circuits do not provide symmetrical rise to rise and fall to fall switching delays between the ECL input signals and the CMOS output signal. The present ECL to CMOS translators are also too sensitive to variations in process parameters, power supply voltages, temperature and manufacturing tolerances.

Figure 4:
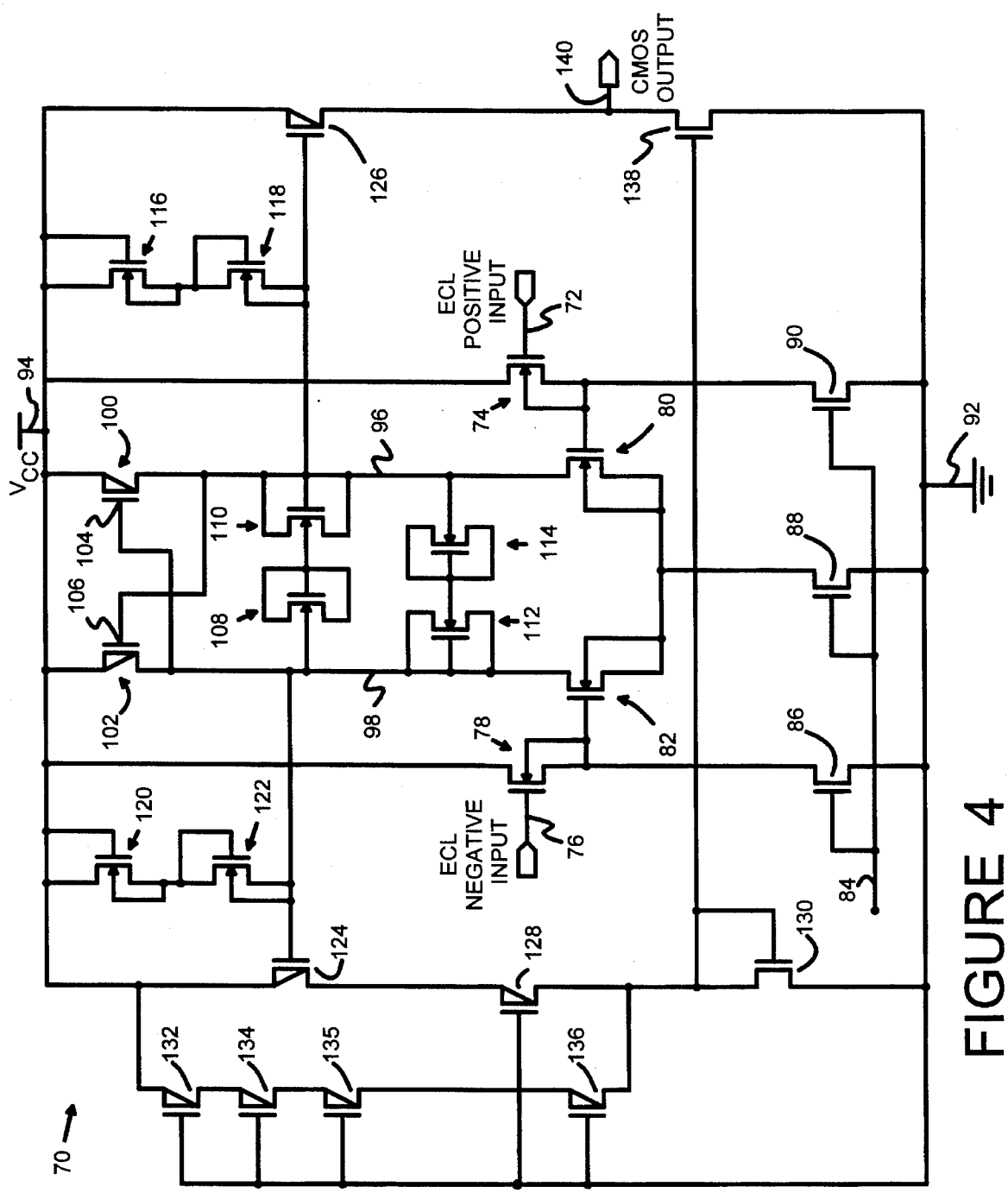
FIG. 4 is an illustrative diagram of an ECL to CMOS translator circuit with symmetrical rise to rise and fall to fall delays according to the present invention.

FIG. 4 is an illustrative diagram of an ECL to CMOS translator circuit 70 with symmetrical rise to rise and fall to fall delays according to the present invention. The ECL positive input 72 and the ECL negative input 76 are the inputs to the gates of the transistor 74 and the transistor 78, respectively. These two transistors down convert the ECL inputs by a $V_{gs}$ level, which is the voltage difference between the gate and the source of a CMOS transistor. The transistor 74 source and the transistor 78 source are the inputs to the transistor 80 gates and the transistor 82 gates, respectively. Transistors 80 and 82 form a differential amplifier. There are current sources implemented by the transistors 86, 90, and 88, which are connected to the transistor 78 source, the transistor 74 source, and the transistors 80 and 82 sources, respectively.

The drain of the transistor 80 is connected to the circuit node 96 and the drain of the transistor 82 is connected to the circuit node 98. The circuit node 96 is also connected to the source of the p channel transistor 100 and the gate 106 of the p channel transistor 102. Similarly, the circuit node 98 is connected to the source of the p channel transistor 102 and the gate 104 of the p channel transistor 100.

In operation, when the transistor 80 is turned "ON", then the circuit node 96 is pulled low and the p channel transistor 102 is turned "ON". This pulls the circuit node 98 to the power voltage $V_{cc}$ 94, which turns the p channel transistor 100 "OFF". Because the ECL signal input is differential, when the transistor 80 is "ON", the transistor 82 is "OFF", which also sends the circuit node 98 to the power voltage $V_{cc}$ 94, turning the p channel transistor 100 "OFF".

A key objective of the ECL to CMOS translator 70 of the present invention is to achieve symmetrical rise to rise and fall to fall delays. To achieve this characteristic, voltage clamps are implemented between the circuit node 96 and the power voltage $V_{cc}$ 94 and between the circuit node 98 and the power voltage $V_{cc}$ 94, which keep the circuit node 96 and the circuit node 98 from falling below the power voltage $V_{cc}$ 94 minus $2*V_{gs}$ volts ($V_{cc}-2*V_{gs}$). As discussed previously, the voltage $V_{gs}$ is the voltage between a gate and a source of a CMOS transistor. The voltage clamps are implemented by the transistor 116 and the transistor 118 between the power voltage $V_{cc}$ 94 and the circuit node 96, and by the transistor 120 and the transistor 122 between the power voltage $V_{cc}$ 94 and the circuit node 98. By limiting the low state of the circuit node 96 and the circuit node 98, the voltage swing of the circuit node 96 and the circuit node 98 is limited to a small range of between the power voltage $V_{cc}$ 94 and the power voltage $V_{cc}$ 94 minus $2*V_{gs}$ ($V_{cc}-2*V_{gs}$). Without the voltage clamps the circuit node 96, for example, would transition between the power voltage $V_{cc}$ 94 and the ground 92, or about 0 to 5 volts. A smaller voltage swing is much less sensitive to variations in process parameters, power supply voltages, temperature and manufacturing tolerances than a large voltage swing. A smaller voltage swing also results in a symmetrical rise to rise and fall to fall delay between the ECL signal input and the CMOS output.

The ECL to CMOS translator 70 has another device to further limit the voltage swing, which is a voltage clamp to limit the voltage difference between the circuit node 96 and the circuit node 98. This voltage clamp is implemented by the p-n diode 108 and the p-n diode 110 between the circuit node 98 and the circuit node 96, and the p-n diode 112 and the p-n diode 114 between the circuit node 96 and the circuit node 98. The effect of this additional voltage clamp is that the circuit node 96 and the circuit node 98 vary between a low voltage of the power voltage $V_{cc}$ 94 minus $2*V_{gs}$ ($V_{cc}-2*V_{gs}$) and a high voltage of the power voltage $V_{cc}$ 94 minus $2*V_{gs}$ plus $2*V_{pn}$ ($V_{cc}-2*V_{gs}+2*V_{pn}$). The $V_{pn}$ voltage is the voltage drop across a p-n diode and, as explained, the $V_{gs}$ voltage is the voltage drop from a gate to a source of a CMOS transistor. By further limiting the voltage swing of the circuit node 96 and the circuit node 98, the sensitivity to power voltage levels and other parameters is reduced and the symmetry of the rise and fall delays is increased.

For a CMOS transistor the voltage $V_{gs}$ is about 1 volt and for a diode the voltage $V_{pn}$ is about 0.8 volts. For a power voltage $V_{cc}$ of 5 volts, the high voltage of circuit node 96, for example, is (5−2*1+2*0.8)=4.6 volts and the low voltage of circuit node 96 is (5−2*1)=3 volts. Therefore the voltage difference for the high and low voltages of circuit node 96 is 1.6 volts or about a third of the normal CMOS swing of 5 volts.

The circuit node 96 controls the gate of the p channel transistor 126, whose source is coupled to the CMOS output signal 140. The circuit node 98 is coupled to the gate of the p channel transistor 124. The source of the p channel transistor 124 is connected to the drain of the p channel transistor 128. The source of the p channel transistor 128 is connected to the gate and drain of the transistor 130. A series of p channel transistors 132, 134, 135, and 136 are connected from the power voltage $V_{cc}$ 94 to the source of the p channel transistor 128. These p channel transistors, which are always "ON" because their gates are tied to the ground 92, provide a trickle current to keep the transistor 130 slightly turned "ON". Similarly, the p channel transistor 128 is always "ON", because its gate is tied to the ground 92. When the p channel transistor 124 is "ON", then the transistor 130 turns "ON" and the p channel transistor 128 provides a resistive load between the p channel transistor 124 and the transistor 130. When the p channel transistor 124 is "OFF", then the transistor 130 is "OFF"; however, the trickle current through the series of p channel transistors 132, 134, 135, and 136 keep the transistor 130 slightly "ON". The effect is to have virtually no signal delay through the p channel transistor 128. Also, the source of the p channel transistor 124 is coupled directly to the gate of the transistor 138, whose drain is coupled to the CMOS output signal 140.

Figure 5:
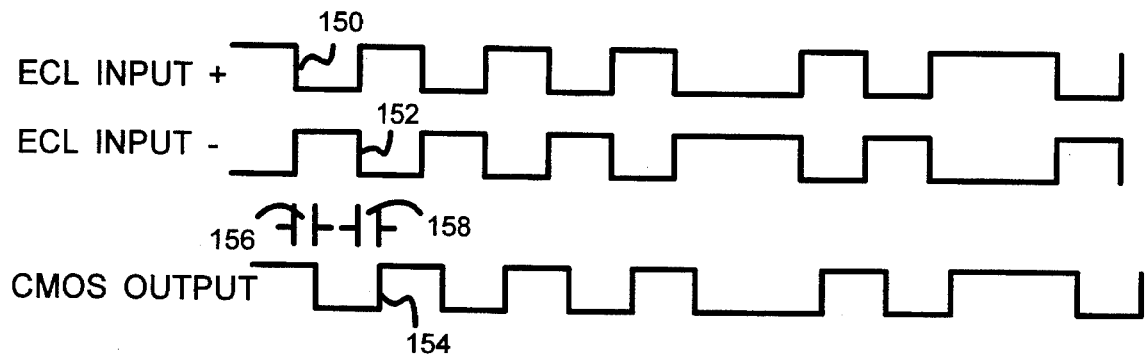
FIG. 5 is an illustrative timing diagram of the relationship between an ECL input signal and a CMOS output signal for an ECL to CMOS translator with symmetrical rise to rise and fall to fall delays according to the present invention.

FIG. 5 is an illustrative timing diagram of the relationship between the ECL input signal and a CMOS output signal for the ECL to CMOS translator 70 with symmetrical rise to rise and fall to fall delays according to the present invention. As shown the delays between the ECL positive input 150 and the ECL negative input 152, and the CMOS output 154 are symmetrical. In particular, the fall to fall delay 156 is equal to the rise to rise delay 158.

The circuit of the present invention provides reduced sensitivity to variations in process parameters, power supply voltages, temperature and manufacturing tolerances. The circuit also provides symmetrical tracking between the rise to rise and the fall to fall delays. Computer simulations have shown that the difference between the rise to rise delay and the fall to fall delay is less than 0.3 ns.

Thus, the present invention has been described herein with reference to a particular embodiment for a particular application. Nonetheless, those having ordinary skill in the art and access to present teachings will recognize additional modifications, applications, and embodiments within the scope thereof. For example, the power supply voltages of the present invention may be replaced by other power supply voltages without departing from the scope of the present invention.

It is therefore intended by the appended claims to cover any and all such applications, modifications and embodiments within the scope of the present invention.

What is claimed is:

1. A translator circuit for providing symmetrical switching delays having a differential amplifier including a first signal line and a second signal line complementary to the first signal, the circuit comprising a first voltage clamp means coupled to the first signal line and to the second signal line for limiting a voltage differential between the first signal line and the second signal line, the first voltage clamp including:

a first pair of p-n diodes coupled in series between the first signal line and the second signal line for limiting the voltage differential between the first signal line and the second signal line; and a second pair of p-n diodes coupled in series between the second signal line and the first signal line for limiting the voltage differential between the second signal line and the first signal line wherein the first and second pair of p-n diodes further increase symmetry in rise and fall delays output from the translator circuit.

2. The translator circuit of claim 1 wherein the first signal line and the second signal line are complementary metal-oxide semiconductor compatible.

3. A translator circuit for providing symmetrical switching delays having a differential amplifier including a first signal line and a second signal line complementary to the first signal and for use with a power line, the circuit comprising:

first voltage clamp means coupled to the first signal line and to the power line for limiting a voltage differential therebetween;

second voltage clamp means coupled to the power line and the second signal line for limiting a voltage differential therebetween; and third voltage clamp means coupled to the first signal line and to the second signal line for limiting a voltage differential therebetween and for increasing symmetry in rise and fall delays output from the translator circuit.

4. The translator circuit of claim 3 wherein the first signal line and the second signal line are complementary metal-oxide semiconductor compatible.

5. The translator circuit of claim 4 wherein the first voltage clamp means further includes:

a first transistor having a drain and a gate coupled to the power line; and a second transistor having a drain and a gate coupled to a source of the first transistor and a source coupled to the first signal line.

6. The translator circuit of claim 5 wherein the second voltage clamp means further includes:

a third transistor having a drain and a gate coupled to the power line; and a fourth transistor having a drain and a gate coupled to a source of the third transistor and a source coupled to the second signal line.

7. The translator circuit of claim 6 wherein the third voltage clamp means further includes:

a first pair of p-n diodes coupled in series between the first signal line and the second signal line for limiting the voltage differential between the first signal line and the second signal line; and a second pair of p-n diodes coupled in series between the second signal line and the first ,signal line for limiting the voltage differential between the second signal line and the first signal line.

8. The translator circuit of claim 7 further comprising:

first switch means coupled to the first signal line and coupled to and responsive to the second signal line for providing an active load and for coupling the first signal line to the power line in response to the second signal line; and second switch means coupled to the second signal line and coupled to and responsive to the first signal line for providing an active load and for coupling the second signal line to the power line in response to the first signal line.

9. The translator circuit of claim 8 wherein the first switch means further comprises a fifth transistor having a source coupled to the first signal line, having a gate coupled to and responsive to the second signal line, and having a drain coupled to the power line.

10. The translator circuit of claim 9 wherein the second switch means further comprises a sixth transistor having a source coupled to the second signal line, having a gate coupled to and responsive to the first signal line, and having a drain coupled to the power line.

11. The translator circuit of claim 10 further comprising:

a seventh transistor having a gate coupled to the second signal line, and a drain coupled to the power line;

an eighth transistor having a source coupled to a lower power voltage;

a resistive load coupled between the power line and a drain and a gate of the eighth transistor; and a resistive load coupled between a source of the seventh transistor and the drain and the gate of the eighth transistor.

12. The translator circuit of claim 11 further comprising:

a ninth transistor having a gate coupled to the source and the drain of the eighth transistor, and a source coupled to the lower power voltage; and a tenth transistor having a drain coupled to the power line, a gate coupled to the first signal line, and a source coupled to the drain of the ninth transistor;

wherein the source of the tenth transistor and the drain of the ninth transistor is an output signal line which is complementary metal-oxide semiconductor compatible.

13. The translator circuit of claim 12 further comprising:

two differential emitter coupled logic signal lines; and down converter means coupled to the differential amplifier and to the differential emitter coupled logic signal lines for level shifting the differential emitter coupled logic signal lines.

14. The translator circuit of claim 13 wherein the differential amplifier means further comprises a first current source coupled to a lower power voltage.

15. The translator circuit of claim 14 further comprising:

second current source means for providing current coupled to the down converter means.

16. A translator circuit having symmetrical switching delays for generating an output signal which is complementary metal-oxide semiconductor compatible having a differential amplifier responsive to differential input emitter coupled logic signals for generating a first signal and a second signal complementary to the first signal, the translator comprising:

first voltage clamp means coupled to an upper power voltage and to the first signal for limiting voltage differential between the upper power voltage and the first signal;

second voltage clamp means coupled to the upper power voltage and to the second signal for limiting a voltage differential between the upper power voltage and the second signal; and third voltage clamp means coupled to the first signal and to the second signal for limiting a voltage differential therebetween and for increasing symmetry in rise and fall delays between the input emitter coupled logic signals and the output signal.

17. The translator circuit of claim 16 wherein:

the first voltage clamp means further includes a first transistor having a drain and a gate coupled to the power line and a second transistor having a drain and a gate coupled to a source of the first transistor and a source coupled to the first signal line;

the second voltage clamp means further includes a third transistor having a drain and a gate coupled to the power line and a fourth transistor having a drain and a gate coupled to a source of the third transistor and a source coupled to the second signal line; and the third voltage clamp means further includes a first pair of p-n diodes coupled in series between the first signal line and the second signal line for limiting the voltage differential between the first signal line and the second signal line and a second pair of p-n diodes coupled in series between the second signal line and the first signal line for limiting the voltage differential between the second signal line and the first signal line.

* * * * *